(12) United States Patent
Cui

(10) Patent No.: US 11,856,834 B2
(45) Date of Patent: Dec. 26, 2023

(54) DISPLAY SUBSTRATE AND METHOD FOR PREPARING THE SAME, AND DISPLAY DEVICE

(71) Applicant: BOE TECHNOLOGY GROUP CO., LTD., Beijing (CN)

(72) Inventor: Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 449 days.

(21) Appl. No.: 17/254,811

(22) PCT Filed: May 27, 2020

(86) PCT No.: PCT/CN2020/092528
§ 371 (c)(1),
(2) Date: Dec. 21, 2020

(87) PCT Pub. No.: WO2020/253481
PCT Pub. Date: Dec. 24, 2020

(65) Prior Publication Data
US 2021/0265601 A1 Aug. 26, 2021

(30) Foreign Application Priority Data
Jun. 21, 2019 (CN) .......................... 201910544739.1

(51) Int. Cl.
*H10K 71/00* (2023.01)
*B32B 27/08* (2006.01)
(Continued)

(52) U.S. Cl.
CPC ............. *H10K 71/00* (2023.02); *B32B 27/08* (2013.01); *B32B 37/06* (2013.01); *B32B 37/08* (2013.01);
(Continued)

(58) Field of Classification Search
None
See application file for complete search history.

(56) References Cited

U.S. PATENT DOCUMENTS

| 2014/0097002 A1 | 4/2014 | Sachs et al. |
| 2019/0207149 A1 | 7/2019 | Yu |
| 2020/0176772 A1* | 6/2020 | Yamamoto ............ H01M 4/525 |

FOREIGN PATENT DOCUMENTS

| CN | 104704930 A | 6/2015 |
| CN | 107093680 A | 8/2017 |

(Continued)

OTHER PUBLICATIONS

ISA China National Intellectual Property Administration, International Search Report and Written Opinion Issued in Application No. PCT/CN2020/092528, dated Aug. 21, 2020, WIPO, 14 pages.

(Continued)

*Primary Examiner* — Michael Lebentritt
(74) *Attorney, Agent, or Firm* — McCoy Russell LLP

(57) ABSTRACT

The present disclosure provides a display substrate, a method for preparing the same, and a display device. The display substrate includes an insulating pattern whose surface layer is composed of a hydrophobic fluorine-containing material, so the organic ink used to prepare a light emitting layer does not overflow outside a pixel area. The method for preparing the display substrate includes: forming a rheological insulating material layer on the base substrate; curing the rheological insulating material layer, and patterning the cured insulating material layer to obtain an insulating pattern; heating the insulating pattern, to gather the hydrophobic insulating structure on a surface of the insulating pattern away from the base substrate; heating the gathered hydrophobic insulating structure to melt it, and then cooling the molten hydrophobic insulating structure to form a metal pattern on the surface of the insulating pattern.

13 Claims, 2 Drawing Sheets

(51) Int. Cl.
    *B32B 37/06*         (2006.01)
    *B32B 37/08*         (2006.01)
    *H10K 50/844*       (2023.01)

(52) U.S. Cl.
    CPC ...... *H10K 50/844* (2023.02); *B32B 2307/728* (2013.01); *B32B 2457/206* (2013.01)

(56) References Cited

FOREIGN PATENT DOCUMENTS

| | | | | |
|---|---|---|---|---|
| CN | 107393945 A | | 11/2017 | |
| CN | 108172605 A | | 6/2018 | |
| CN | 109585502 A | | 4/2019 | |
| CN | 109817669 A | | 5/2019 | |
| CN | 110233170 A | | 9/2019 | |
| JP | 2016056300 A | | 4/2016 | |
| KR | 102230653 B1 | * | 3/2021 | |
| KR | 20230039320 A | * | 3/2023 | |
| WO | WO-2011067895 A1 | * | 6/2011 | ......... H01L 51/5088 |
| WO | WO-2021260487 A1 | * | 12/2021 | |

OTHER PUBLICATIONS

State Intellectual Property Office of the People's Republic of China, Office Action and Search Report Issued in Application No. 201910544739.1, dated Dec. 14, 2020, 12 pages. (Submitted with Partial Translation).

* cited by examiner

US 11,856,834 B2

DISPLAY SUBSTRATE AND METHOD FOR PREPARING THE SAME, AND DISPLAY DEVICE

CROSS REFERENCE TO RELATED APPLICATIONS

This application is the U.S. national phase of PCT Application No. PCT/CN2020/092528 filed on May 27, 2020, which claims a priority to Chinese Patent Application No. 201910544739.1 filed on Jun. 21, 2019, the disclosures of which are incorporated in their entirety by reference herein.

TECHNICAL FIELD

The present disclosure relates to the field of display technology, in particular, to a display substrate and a method for preparing the same, and a display device including the display substrate.

BACKGROUND

With the development of society, people's demand on the resolution of display devices goes higher and higher. In the limited space, the top-emitting OLED display device has a higher resolution. However, as for a top-emitting OLED display device, the thickness of the cathode is relatively small. When the area of the OLED display device is relatively large, the IR drop on the cathode is very significant. In order to ensure the display effect of the OLED display device, an auxiliary electrode may be formed on a surface of the base substrate away from the pixel definition layer, and the auxiliary electrode is connected in parallel with the cathode to reduce the resistance of the cathode. However, the auxiliary electrode requires an additional patterning process, which increases the complexity of the method for preparing the OLED display device, and increases the number of patterning processes for preparing the OLED display device and the production cost.

SUMMARY

In an aspect, a display substrate is provided, includes an insulating pattern and a metal pattern that are stacked on a base substrate, in which the metal pattern is located on a surface of the insulating pattern away from the base substrate, and an orthogonal projection of the metal pattern on the base substrate falls within an orthogonal projection of the insulating pattern on the base substrate; and in which the insulating pattern includes a fluorine-containing hydrophobic insulating material, and a fluorine content in the insulating pattern increases gradually along a direction from the base substrate to the metal pattern.

Optionally, the fluorine-containing hydrophobic insulating material includes 0.1 to 5% by mass of fluorine.

Optionally, a fluorine content in a surface layer of the insulating pattern proximate to the metal pattern is in a range from 0.1 to 5% by mass, and a fluorine content in a bottom layer of the insulating pattern proximate to the base substrate is 0.1% by mass or less, in which a thickness of the surface layer and a thickness of the bottom layer are both in a range from 5 to 15 nm.

Optionally, the display substrate is an OLED display substrate, and the insulating pattern is a pattern of a pixel defining layer of the OLED display substrate.

Optionally, the fluorine-containing hydrophobic insulating material is any one selected from a group consisting of fluorine-substituted silicone resin, fluorine-substituted polyimide, fluorine-substituted acrylic resin, fluorine-substituted polymethacrylic resin; silicone resin, polyimide, acrylic resin, polymethacrylic resin, that are doped with fluorine-substituted organic small molecule compounds; and any combination thereof.

Optionally, the display substrate further includes: a planar cathode located on a surface of the metal pattern away from the base substrate, in which the planar cathode is electrically connected to the metal pattern.

On another aspect, the present disclosure also provides a display device including the above-mentioned display substrate.

In still another aspect, the present disclosure also provides a method for preparing a display substrate, including: providing a base substrate, and forming a rheological insulating material layer on the base substrate, in which the rheological insulating material layer includes a hydrophobic insulating structure, the hydrophobic insulating structure includes a hydrophobic insulating housing and metal wrapped in the hydrophobic insulating housing; curing the rheological insulating material layer, and patterning the cured insulating material layer to obtain an insulating pattern; heating the insulating pattern, to gather the hydrophobic insulating structure on a surface of the insulating pattern away from the base substrate; and heating the hydrophobic insulating structure gathered on the surface of the insulating pattern away from the base substrate to melt it, and then cooling the molten hydrophobic insulating structure to form a metal pattern on a surface of the insulating pattern.

Optionally, the insulating pattern is a pattern of a pixel defining layer of the OLED display substrate, and the method further includes: forming a light emitting layer in a pixel area defined by the pattern of the pixel definition layer after the forming the insulating pattern, and before heating the hydrophobic insulating structure gathered on the surface of the insulating pattern away from the base substrate.

Optionally, the hydrophobic insulating housing is made of a fluorine-containing hydrophobic insulating material.

Optionally, the hydrophobic insulating housing is made of fluorine-substituted silicone resin, fluorine-substituted polyimide resin, fluorine-substituted acrylic resin, fluorine-substituted polymethacrylic resin; silicone resin, polyimide, acrylic resin, polymethacrylic resin, that are doped with fluorine-substituted organic small molecule compounds; and any combination thereof.

Optionally, the fluorine content in the hydrophobic insulating housing is in a range from 0.1 to 5% by mass.

Optionally, the heating the hydrophobic insulating structure gathered on the surface of the insulating pattern away from the base substrate to melt it includes: irradiating the hydrophobic insulating structure by a laser, to allow a temperature at the hydrophobic insulating structure greater than the melting point of the metal.

Optionally, the cooling the molten hydrophobic insulating structure includes: cooling the molten hydrophobic insulating housing and the metal in an inert atmosphere, to form a metal pattern on a surface of the insulating pattern.

Optionally, the method further includes: forming a planar cathode after the forming the metal pattern on the upper surface of the pattern of the pixel defining layer, in which the cathode is electrically connected to the metal pattern.

Optionally, the metal constituting the metal pattern is a metal having a melting point lower than 1000° C.

Optionally, the metal is magnesium, aluminum, silver, copper, or an alloy of two or more metals.

Optionally, after the metal in the hydrophobic insulating structure has been partially melted, the heating is stopped and the metal is cooled to form the metal pattern.

Optionally, the partial melting of the metal means that more than 50% of the metal is melted.

Optionally, the melting of more than 50% of the metal is controlled by a heating temperature and a heating time.

DETAILED DESCRIPTION

Figure 1:
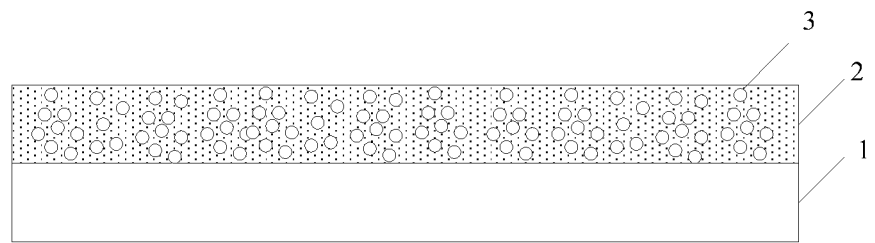
FIG. 1 is a schematic view showing a structure after forming a rheological insulating material layer on a base substrate according to a method of an embodiment of the present disclosure.

The technical problems, the technical solutions, and the advantages of the present invention will be more clearly described in combination with the drawings and specific embodiments.

Embodiments of the present disclosure provide a display substrate, a method for preparing the same, and a display device including the display substrate. The method for preparing a display substrate according to an embodiment of the present disclosure can reduce the number of patterning processes, thereby simplifying the production process and reducing the production cost.

According to an embodiment of the present disclosure, a display substrate is provided, including an insulating pattern and a metal pattern that are stacked in sequence on a base substrate, in which the metal pattern is located on a surface of the insulating pattern away from the base substrate, and an orthogonal projection of the metal pattern on the base substrate falls within an orthogonal projection of the insulating pattern on the base substrate; and in which the insulating pattern includes a fluorine-containing hydrophobic insulating material, and a fluorine content in the insulating pattern increases gradually along a direction from the base substrate to the metal pattern.

Optionally, the fluorine-containing hydrophobic insulating material includes 0.1 to 5% by mass of fluorine.

Optionally, a fluorine content in a surface layer of the insulating pattern proximate to the metal pattern is in a range from 0.1 to 5% by mass, and a fluorine content in a bottom layer of the insulating pattern proximate to the base substrate is 0.1% by mass or less, in which a thickness of the surface layer and a thickness of the bottom layer are both in a range from 5 to 15 nm. Generally, the thickness of the insulating pattern is in a range from 500 nm to 5 μm. The thickness of the surface layer is about 1 to 10%, optionally about 1 to 3% of the thickness of the entire insulating pattern. For example, the thickness of the surface layer is in a range from 5 to 15 nm.

In the foregoing embodiment, since the surface layer of the insulating pattern is a fluorine-containing hydrophobic material layer, the organic ink for preparing the light emitting layer will not overflow outside the pixel area. This improves the performance of the display substrate or display device. In addition, since the orthogonal projection of the metal pattern on the base substrate falls within the orthogonal projection of the insulating pattern on the base substrate, the insulating pattern and the metal pattern located on the insulating pattern can be formed simultaneously by a single patterning process without preparing the insulating pattern and the metal pattern separately through two patterning processes. Therefore, the method of the embodiment of the present disclosure can reduce the number of patterning processes for preparing the display substrate, and reduce the production cost of the display substrate.

Optionally, the insulating pattern may be a pattern of a gate insulating layer. Optionally, the metal pattern may be a pattern of a gate metal layer on a pattern of a gate insulating layer. Even optionally, the insulating pattern may be a pattern of an interlayer insulating layer. Optionally, the metal pattern may be a pattern of source and drain metal layers on the pattern of the interlayer insulating layer. For example, the insulating pattern may be a pattern of a gate insulating layer, and the metal pattern may be a pattern of a gate metal layer on a pattern of a gate insulating layer; or, the insulating pattern may be a pattern of an interlayer insulating layer, and the metal pattern may be a pattern of source and drain metal layers on the pattern of the interlayer insulating layer.

Optionally, the display substrate may be an OLED display substrate, and the insulating pattern may be a pattern of a pixel defining layer of the OLED display substrate. Optionally, a metal pattern is provided on the pattern of the pixel definition layer. The metal pattern can be used as an auxiliary electrode connected in parallel with the cathode. The metal pattern reduces the resistance of the cathode, thereby solving the problem of IR drop on the cathode and ensuring the display effect of the display substrate.

Optionally, the display substrate is an OLED display substrate, and the display substrate further includes a planar cathode located on the surface of the metal pattern away from the base substrate, in which the cathode and the metal pattern are electrically connected.

Optionally, the insulating pattern is a pattern of a pixel definition layer of an OLED display substrate, and a surface of the insulating pattern away from the base substrate includes a hydrophobic insulating material. Therefore, the upper surface of the pattern of the pixel defining layer has hydrophobicity. When the organic ink is ink-jet printed in the pixel area to prepare the light emitting layer, the organic ink will form a large contact angle on the upper surface of the pattern of the pixel definition layer with hydrophobicity and present a droplet shape, thereby defining the formed light emitting layer in the pixel area. Therefore, the display substrate according to the embodiment of the present disclosure can effectively prevent the problem of organic ink overflow.

According to an embodiment of the present disclosure, the present disclosure also provides a display device, including the display substrate described in any one of the above. The display device includes, but is not limited to a radio frequency unit, a network module, an audio output unit, an input unit, a sensor, a display unit, a user input unit, an interface unit, a memory, a processor, a power supply and other components. A person skilled in the art will understand that the components of the above display device do not constitute a limitation on the display device. The display device may include more or less components than the above-listed components, or a combination of some of these components, or an arrangement of components different from the above components. In the embodiment of the present disclosure, the display device includes, but is not limited to, a displayer, a mobile phone, a tablet computer, a television, a wearable electronic device, a navigation display device, a digital photo frame, and the like. The display device may also include a flexible circuit board, a printed circuit board, a backplane, and the like.

According to an embodiment of the present disclosure, a method for preparing a display substrate is provided, including: providing a base substrate, and forming a rheological insulating material layer on the base substrate, in which the rheological insulating material layer includes a hydrophobic insulating structure, the hydrophobic insulating structure includes a hydrophobic insulating housing and metal wrapped in the hydrophobic insulating housing; curing the rheological insulating material layer, and patterning the cured insulating material layer to obtain an insulating pattern; heating the insulating pattern layer, to gather the hydrophobic insulating structure on a surface of the insulating pattern away from the base substrate; and heating the hydrophobic insulating structure gathered on the surface of the insulating pattern away from the base substrate to melt it, and then cooling the molten hydrophobic insulating structure to form a metal pattern on a surface of the insulating pattern.

In this embodiment, the insulating pattern and the metal pattern located on the insulating pattern can be formed by a single patterning process, without need of separately preparing the insulating pattern and the metal pattern by two patterning processes. Therefore, the method according to the embodiment of the present disclosure can reduce the number of patterning processes for preparing the display substrate and reduce the production cost of the display substrate. When the insulating pattern is a pattern of the pixel definition layer, the technical solution of the present disclosure can be used to form a metal pattern on the pattern of the pixel definition layer as an auxiliary electrode. The auxiliary electrode solves the problem of IR drop on the cathode, thereby ensuring the display effect of the display substrate.

In the embodiments of the present disclosure, the rheology in the "rheological insulating material layer" refers to the deformation and flow properties of a substance under the action of external force, and mainly refers to the relationship between stress, deformation, deformation rate and viscosity during the processing. The viscosity of the fluid is different, and the quantitative relationship between the shear stress applied to the fluid and the shear deformation rate (shear rate) is also different. Optionally, the rheological insulating material in the embodiments of the present disclosure refers to an insulating material having a Brookfield viscosity of 2 to 10 cps, and optionally 3 to 8 cps. For example, the Brookfield viscosity of the rheological insulating material may be about 4, 5, 6, or 7 cps.

Optionally, by using the technical solution of the embodiment of the present disclosure, the pattern of the gate insulating layer and the pattern of the gate metal layer on the gate insulating layer can be prepared through a single patterning process; and/or by using the technical solution of the embodiment of the present disclosure, the pattern of the interlayer insulating layer and the pattern of the source and drain metal layers on the interlayer insulating layer can be prepared through a single patterning process; and/or by using the technical solution of the embodiment of the present disclosure, the pattern of the pixel definition layer and the metal pattern on the pixel defining layer can be prepared through a single patterning process. The metal pattern can be used as an auxiliary electrode connected in parallel with the cathode. The auxiliary cathode reduces the resistance of the cathode, thereby solving the problem of IR drop on the cathode and ensuring the display effect of the display substrate.

When the hydrophobic insulating structure gathered on the surface of the insulating pattern away from the base substrate is heated, in order to prevent the heat from affecting the performance of other devices of the display substrate, the heating position can be defined only on the upper surface layer of the insulating pattern. Specifically, a controllable laser can be used to irradiate the upper surface of the insulating pattern. The laser has high-precision properties and can define the heated part on the upper surface layer of the insulating pattern. The upper surface layer of the insulating pattern is irradiated by a laser for a set period of time. The heat generated by the laser on the upper surface of the insulating pattern causes the temperature of the upper surface of the insulating pattern to exceed the melting point of the hydrophobic insulating housing and the metal, so as to melt the hydrophobic insulating housing and the metal. At this time, the metal is exposed from the hydrophobic insulating housing, and a metal pattern will be formed on the surface of the insulating pattern after cooling.

Optionally, the hydrophobic insulating housing may be composed of a fluorine-containing hydrophobic insulating material. For example, the fluorine-containing hydrophobic insulating material is any one selected from the group consisting of fluorine-substituted silicone resin, fluorine-substituted polyimide, fluorine-substituted acrylic resin, fluorine-substituted polymethacrylic resin; silicone resin, polyimide, acrylic resin, polymethacrylic resin, that are doped with fluorine-substituted organic small molecule compounds; and any combination thereof. The fluorine-containing materials have very low surface energy. When the rheological insulating material is cured, for example, by heating, the fluorine-containing hydrophobic insulating material has a tendency to migrate to the surface, and finally accumulate on the surface of the insulating material.

Optionally, the fluorine content in the hydrophobic insulating housing may be in a range from 0.1 to 5% by mass. The fluorine content in the hydrophobic insulating housing is within the above range, which can ensure that the upper surface of the insulating material is enriched with the hydrophobic insulating material after the rheological insulating material is cured. Further, the fluorine content may be in a range from 0.5 to 4% by mass, and still further be in a range from 0.8 to 2.5% by mass.

Optionally, the insulating material can be cured by a means of light curing or thermal curing. Light curing is to irradiate the rheological insulating material by ultraviolet light, so as to cure the rheological insulating material. Thermal curing is to heat the rheological insulating material, so as to cure the rheological insulating material.

Optionally, the metal wrapped by the hydrophobic insulating housing may be a conventional metal with good conductivity, for example, gold, aluminum, copper, etc. Optionally, the metal is a metal with a relatively low melting point, for example, a metal with a melting point lower than 1000° C. The metal may be, for example, magnesium, aluminum, silver, copper, or an alloy of two or more of these metals. There is no need to heat the hydrophobic insulating structure to a very high temperature, in order to melt the hydrophobic insulating housing and the metal. It should be well known that the melting point of the hydrophobic insulating housing is generally lower than the melting point of the metal. When the hydrophobic insulating structure is heated, the hydrophobic insulating housing first melts and exposes the metal, and then the metal melts. After the metal is partially melted, the heating can be stopped, and then the metal is cooled, to form a metal pattern on the surface of the insulating pattern. For example, about 50% or more of the metal is melted, preferably 50% to 80% of the metal is melted, which can prevent the insulating pattern of the underlying layer from being heated due to excessive heating time or excessive heating temperature. Here, the proportion of molten metal can be controlled by visual observation or by a heating temperature and a heating time. Optionally, the molten hydrophobic insulating housing and the metal are cooled in an inert atmosphere, to form a metal pattern on a surface of the insulating pattern.

Optionally, the hydrophobic insulating structure may be spherical, including a spherical hollow hydrophobic insulating housing and a metal located in the hydrophobic insulating housing. Of course, the hydrophobic insulating structure of this embodiment is not limited to a spherical shape, and may also have other shapes, such as an elliptical spherical shape, an irregular shape, and the like. However, preferably, the hydrophobic insulating structure may be spherical, which facilitates the migration and the aggregation of the hydrophobic insulating structure to the surface when heated.

Optionally, the display substrate is an OLED display substrate, and the insulating pattern is a pattern of a pixel definition layer of the OLED display substrate. The method further includes: forming a light emitting layer in a pixel area defined by the pattern of the pixel definition layer after the forming the insulating pattern, and before heating the hydrophobic insulating structure gathered on the surface of the insulating pattern away from the base substrate.

Since the upper surface of the pattern of the pixel definition layer is the hydrophobic insulating structure, the upper surface of the pattern of the pixel definition layer is hydrophobic. When the organic ink is ink-jet printed in the pixel area to prepare the light emitting layer, the organic ink will form a large contact angle on the upper surface of the pattern of the pixel definition layer with hydrophobicity and present a droplet shape. This can effectively prevent the problem of organic ink overflow, thereby defining the formed light emitting layer within the pixel area.

When heating the hydrophobic insulating structure on the upper surface of the pattern of the pixel definition layer, in order to avoid affecting the performance of other devices of the display substrate, the heating position may be defined to only the upper surface of the pattern of the pixel definition layer. Specifically, a laser may be used to irradiate the upper surface of the pattern of the pixel definition layer. The laser has high-precision feature, and the heating position is defined on the upper surface of the pattern of the pixel definition layer. The upper surface of the pattern of the pixel definition layer is irradiated with a laser for a set period of time. The heat generated by the laser on the upper surface of the pattern of the pixel definition layer causes the temperature of the upper surface of the insulating pattern to exceed the melting point of the hydrophobic insulating housing and the metal, so as to melt the hydrophobic insulating housing and the metal. At this time, the metal is exposed from the hydrophobic insulating housing, and a metal pattern is formed on the surface of the pattern of the pixel definition layer after cooling.

Further, the method further includes: forming a planar cathode after the forming the metal pattern on the upper surface of the pattern of the pixel defining layer, in which the cathode is electrically connected to the metal pattern.

In a top-emission OLED display substrate, the thickness of the cathode is usually very thin, resulting that the cathode has a very large resistance. However, in this embodiment, the metal pattern is connected in parallel with the cathode, to effectively reduce the resistance of the cathode, thereby solving the problem of IR drop on the cathode.

The display substrate to be protected by the present disclosure also includes the display substrate prepared by the above preparation method.

In the following, taking the insulating pattern as the pattern of the pixel defining layer as an example, the method for preparing the display substrate of the embodiment of the present disclosure will be further introduced with reference to the accompanying drawings.

The method for preparing the display substrate according to the embodiment of the present disclosure includes the following steps S1-S5.

Step S1: As shown in FIG. 1, a base substrate 1 is provided, and a rheological insulating material layer 2 is formed on the base substrate 1. The rheological insulating material layer 2 includes a hydrophobic insulating structure 3, and the hydrophobic insulating structure 3 includes a hydrophobic insulating housing and a metal wrapped in the hydrophobic insulating housing.

The base substrate 1 includes a substrate, a thin film transistor array formed on the substrate, and an anode. Since the method of preparing the thin film transistor array and the anode is the same as the prior art, it will not be repeated herein. The base substrate 1 may be a flexible base substrate or a rigid base substrate. Optionally, the flexible base substrate may be a polyimide substrate, and the rigid base substrate may be a quartz substrate or a glass substrate.

In addition to the hydrophobic insulating structure 3, other components contained in the rheological insulating material 2 may be those used in the prior art to make the pixel definition layer.

Figure 2:
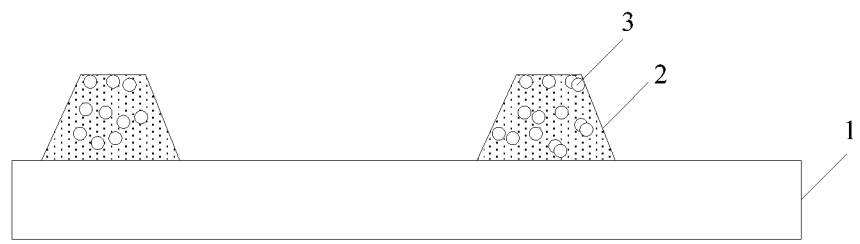
FIG. 2 is a schematic view showing a structure after curing an insulating material layer and patterning the cured insulating material layer to obtain an insulating pattern according to a method of an embodiment of the present disclosure.

Step S2: As shown in FIG. 2, the rheological insulating material layer 2 is cured, and the cured insulating material layer 2 is patterned to obtain a pattern of the pixel definition layer. The pattern of the pixel defining layer defines a plurality of pixel areas.

In this embodiment, the insulating material layer 2 can be cured by light curing or thermal curing. Light curing is to irradiate the rheological insulating material layer 2 with ultraviolet light, so as to cure the rheological insulating material. Thermal curing is to heat the rheological insulating material layer 2, so as to cure the rheological insulating material.

When the insulating material layer 2 itself is made of photosensitive material, a mask can be used to expose the insulating material layer 2 and directly form the pattern of the pixel definition layer after development. When the insulating material 2 is not a photosensitive material, a photoresist is coated on the surface of the insulating material layer 2, and a mask is used to expose and develop the photoresist to form a photoresist retention area and a photoresist removal area. The insulating material layer 2 in the photoresist removal area is etched away, and the remaining photoresist is removed to form a pattern of the pixel definition layer.

Figure 3:
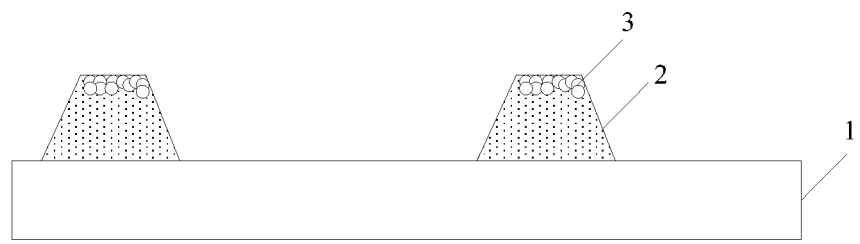
FIG. 3 is a schematic view showing a structure after heating the insulating pattern, to gather the hydrophobic insulating structure on a surface of the insulating pattern away from the base substrate according to a method of an embodiment of the present disclosure.

Step S3: As shown in FIG. 3, the pattern of the pixel definition layer is baked, so that the upper surface of the pixel definition layer has a hydrophobic insulating structure 3.

After step S2, the hydrophobic insulating structures 3 are evenly distributed in the pattern of the pixel definition layer. The pattern of the pixel definition layer is baked, so that the hydrophobic insulating structure 3 is gathered on the upper surface of the pattern of the pixel definition layer. Specifically, the hydrophobic insulating housing of the hydrophobic insulating structure 3 may be a fluorine-containing hydrophobic insulating material, for example, fluorine-containing silicone, fluorine-containing polyimide, and fluorine-containing transparent resin. The fluorine-containing materials have very low surface energy. When the pattern of the pixel definition layer is baked, the fluorine-containing hydrophobic insulating material has a tendency to migrate to the surface, and is finally enriched on the upper surface of the pixel definition layer.

The fluorine content in the hydrophobic insulating housing may be in a range from 0.1 to 5% by mass. The above fluorine content range can ensure that the upper surface of the pixel definition layer is enriched with the hydrophobic insulating housing after the pixel defining layer is baked.

Figure 4:
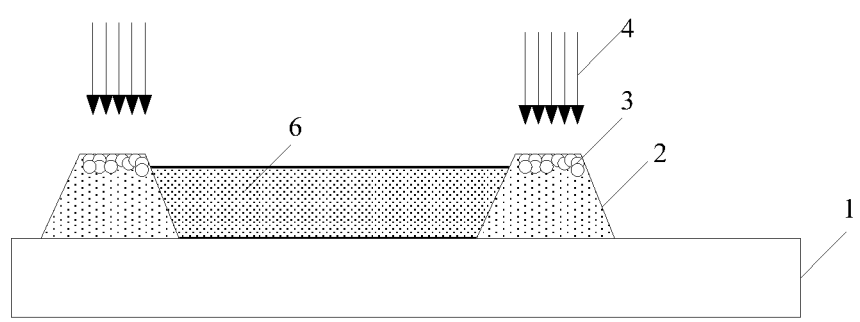
FIG. 4 is a schematic view showing a structure after irradiating the hydrophobic insulating structure by a laser according to a method of an embodiment of the present disclosure.

Step S4: As shown in FIG. 4, a light emitting layer 6 is formed in the pixel area. A laser 4 is used to irradiate the hydrophobic insulating structure 3 on the upper surface of the pattern of the pixel definition layer. Since the upper surface of the pattern of the pixel definition layer is the hydrophobic insulating structure 3, the upper surface of the pattern of the pixel definition layer is hydrophobic. When the organic ink is ink-jet printed in the pixel area to prepare the light emitting layer 6, the organic ink will form a large contact angle on the upper surface of the pattern of the pixel definition layer with hydrophobicity and present a droplet shape. This can effectively prevent the problem of organic ink overflow, thereby defining the formed light emitting layer 6 within the pixel area.

When the hydrophobic insulating structure 3 is heated, in order to prevent the heat from affecting the performance of other devices of the display substrate, the laser 4 is used to irradiate the upper surface of the pattern of the pixel definition layer. The laser has high-precision feature, and the heated position is defined on the upper surface of the pattern of the pixel definition layer.

Figure 5:
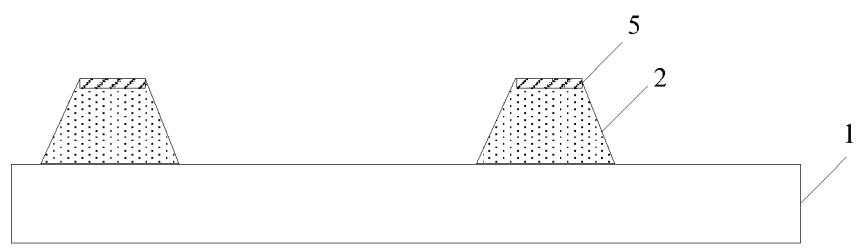
FIG. 5 is a schematic view showing a structure after forming a metal pattern according to a method of an embodiment of the present disclosure.

Step S5: As shown in FIG. 5, a metal pattern 5 is formed on the upper surface of the pattern of the pixel definition layer. The upper surface of the pattern of the pixel definition layer is irradiated with a laser for a set period of time. The heat generated by the laser on the upper surface of the pattern of the pixel definition layer causes the temperature of the upper surface of the insulating pattern to exceed the melting point of the hydrophobic insulating housing and the metal, so as to melt the hydrophobic insulating housing and the metal, and to expose the metal from the hydrophobic insulating housing. After the cooling, a metal pattern 5 is formed on the upper surface of the pattern of the pixel definition layer.

In this embodiment, the metal in the hydrophobic insulating housing may be a conventional metal with good conductivity, for example, gold, aluminum, copper, etc. It is preferably a metal with a relatively low melting point, for example, a metal with a melting point lower than 1000° C. By using a metal with a low melting point, there is no need to heat the hydrophobic insulating structure to a very high temperature, in order to melt the hydrophobic insulating housing and the metal. It should be understood that the melting point of the hydrophobic insulating housing is generally lower than the melting point of the metal. When the hydrophobic insulating structure 3 is heated, the hydrophobic insulating housing first melts and exposes the metal, and then the metal melts again. After the metal is partially melted, the heating can be stopped, and after the molten metal is cooled, a metal pattern 5 is formed on the upper surface of the pattern of the pixel definition layer.

After the above steps S1 to S5, a cathode of the OLED display substrate is further formed on the base substrate 1, in which the cathode is connected in parallel with the metal pattern 5. The metal pattern as an auxiliary cathode can reduce the resistance of the cathode, thereby solving the problem of IR drop on the cathode.

By using the method of the embodiment of the present disclosure, the pattern of the pixel definition layer and the auxiliary electrode can be formed by only a single patterning process, without need of separately preparing the pattern of the pixel definition layer and the auxiliary electrode by two patterning processes. Therefore, the method according to the embodiment of the present disclosure can reduce the number of patterning processes for preparing the display substrate and reduce the production cost of the display substrate.

In the embodiments of the method according to the present disclosure, the serial numbers of the steps cannot be used to define the sequence of the steps. As for one skilled in the art, the changes in the order of steps without paying creative work also fall within the scope of the present disclosure. It should be noted that some embodiments in this specification are described in a progressive manner, and the same or similar parts among these embodiments can be referred to each other. The key description of each embodiment is the difference from other embodiments. In particular, as for specific examples, since they are basically similar to the product implementation solutions, the description is relatively simple. For related content, please refer to the implementation solutions of the product. In the description of the above embodiments of the present disclosure, the specific features, structures, materials or features may be combined in any suitable manner in any one or more embodiments or examples.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly. Moreover, it will be understood that when an element, such as a layer, film, region, or substrate, is referred to as being "on" or "under" another element, the element may be directly "on" or "under" another element, or there may be an intermediate element.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A method for preparing a display substrate, comprising:
   providing a base substrate, and forming a rheological insulating material layer on the base substrate, wherein the rheological insulating material layer comprises a hydrophobic insulating structure, the hydrophobic insulating structure comprises a hydrophobic insulating housing and metal wrapped in the hydrophobic insulating housing;
   curing the rheological insulating material layer, and patterning the cured insulating material layer to obtain an insulating pattern;
   heating the insulating pattern, to gather the hydrophobic insulating structure on a surface of the insulating pattern away from the base substrate; and
   heating the hydrophobic insulating structure gathered on the surface of the insulating pattern away from the base substrate to melt it, and then cooling the molten hydrophobic insulating structure to form a metal pattern on the surface of the insulating pattern.

2. The method of claim 1, wherein the insulating pattern is a pattern of a pixel definition layer of an OLED display substrate, and the method further comprises:
   forming a light emitting layer in a pixel area defined by the pattern of the pixel definition layer after the forming the insulating pattern, and before heating the hydrophobic insulating structure gathered on the surface of the insulating pattern away from the base substrate.

3. The method of claim 1, wherein the hydrophobic insulating housing is made of a fluorine-containing hydrophobic insulating material.

4. The method of claim 3, wherein the hydrophobic insulating housing is composed of fluorine-substituted silicone resin, fluorine-substituted polyimide resin, fluorine-substituted acrylic resin, or fluorine-substituted polymethacrylic resin.

5. The method of claim 3, wherein a fluorine content of the hydrophobic insulating housing is in a range from 0.1 to 5% by mass.

6. The method of claim 1, wherein the heating the hydrophobic insulating structure gathered on the surface of the insulating pattern away from the base substrate to melt it comprises:
   irradiating the hydrophobic insulating structure by a laser, to allow a temperature at the hydrophobic insulating structure greater than a melting point of the metal.

7. The method of claim 1, wherein the cooling the molten hydrophobic insulating structure comprises:
   cooling the molten hydrophobic insulating housing and the metal in an inert atmosphere, to form a metal pattern on a surface of the insulating pattern.

8. The method of claim 1, wherein the method further comprises: forming a planar cathode after the forming the metal pattern on an upper surface of the pattern of the pixel defining layer, wherein the cathode is electrically connected to the metal pattern.

9. The method of claim 8, wherein the metal constituting the metal pattern is a metal having a melting point lower than 1000° C.

10. The method of claim 9, wherein the metal is magnesium, aluminum, silver, copper, or an alloy of two or more metals.

11. The method of claim 1, wherein after the metal in the hydrophobic insulating structure has been partially melted, the heating is stopped and the metal is cooled to form the metal pattern.

12. The method of claim 11, wherein the partial melting of the metal means that more than 50% of the metal is melted.

13. The method of claim 10, wherein the melting of more than 50% of the metal is controlled by a heating temperature and a heating time.

* * * * *